United States Patent
Seo

(10) Patent No.: US 12,051,392 B2
(45) Date of Patent: Jul. 30, 2024

(54) MEMORY DEVICE AND READ/WRITE METHOD OF MEMORY DEVICE

(71) Applicant: LX Semicon Co., Ltd., Daejeon (KR)

(72) Inventor: Chang Sue Seo, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 242 days.

(21) Appl. No.: 17/548,321

(22) Filed: Dec. 10, 2021

(65) Prior Publication Data

US 2022/0199053 A1    Jun. 23, 2022

(30) Foreign Application Priority Data

Dec. 17, 2020 (KR) ........................ 10-2020-0177183

(51) Int. Cl.
| | | |
|---|---|---|
| G09G 5/393 | (2006.01) | |
| G06F 3/06 | (2006.01) | |
| G11C 7/10 | (2006.01) | |

(52) U.S. Cl.
CPC ........... *G09G 5/393* (2013.01); *G06F 3/0604* (2013.01); *G06F 3/0656* (2013.01); *G06F 3/0658* (2013.01); *G06F 3/0673* (2013.01); *G06F 3/0625* (2013.01); *G09G 2310/08* (2013.01); *G09G 2330/021* (2013.01); *G09G 2360/128* (2013.01); *G09G 2360/18* (2013.01); *G11C 7/1084* (2013.01)

(58) Field of Classification Search
CPC .... G06F 3/0604; G06F 3/0673; G06F 3/0659; G06F 3/0679; G06F 3/0656; G06F 3/061; G06F 3/064; G09G 2330/021; G09G 5/393; G06T 1/60; G06T 1/20; G06T 15/005; G06T 9/00; G06T 9/005; G06T 1/00; G06T 2210/52

See application file for complete search history.

(56) References Cited

U.S. PATENT DOCUMENTS

| | | | |
|---|---|---|---|
| 7,800,573 B2 | 9/2010 | Woo et al. | |
| 10,008,176 B2 | 6/2018 | Kim et al. | |
| 2006/0071897 A1 | 4/2006 | Moon | |
| 2006/0214898 A1 | 9/2006 | Woo et al. | |
| 2007/0222737 A1* | 9/2007 | Kimura | G09G 3/3266 345/100 |
| 2016/0086565 A1* | 3/2016 | Ryu | G09G 5/003 345/211 |
| 2021/0193074 A1* | 6/2021 | Kim | G09G 3/3291 |

FOREIGN PATENT DOCUMENTS

| | | |
|---|---|---|
| JP | 4804036 B2 | 10/2011 |
| KR | 10-0688538 B1 | 3/2007 |
| KR | 10-0864492 B1 | 10/2008 |
| KR | 10-2016-0033549 A | 3/2016 |

\* cited by examiner

*Primary Examiner* — Xiao M Wu
*Assistant Examiner* — Scott E Sonners
(74) *Attorney, Agent, or Firm* — ROTHWELL, FIGG, ERNST & MANBECK, P.C.

(57) ABSTRACT

Disclosed are a memory device and a read/write method of the memory device and, more particularly, a memory device and a read/write method of the memory device capable of reducing power consumption of a display device by reducing a storage operation and an output operation of the memory device for a plurality of pieces of pixel data.

16 Claims, 6 Drawing Sheets

| P_DATA1 | P_DATA2 | P_DATA3 | P_DATA4 | P_DATA5 | P_DATA6 | ... |

|  | [1] | [2] | [3] | [4] | [5] | [6] |  | [n-1] | [n] |
|---|---|---|---|---|---|---|---|---|---|
| array | 1 | 1 | 1 | 1 | 1 | 0 | .... | 0 | 0 |

MEMORY DEVICE AND READ/WRITE METHOD OF MEMORY DEVICE

CROSS REFERENCE TO RELATED APPLICATION

This application claims priority from Republic of Korea Patent Application No. 10-2020-0177183, filed on Dec. 17, 2020, which is hereby incorporated by reference in its entirety.

BACKGROUND

1. Field of Technology

The present disclosure relates to a memory device and a read/write method of the memory device.

2. Description of the Prior Art

A display device may include a data-processing device called a timing controller, a data-driving device called a source driver, and a panel, and the data-processing device may be designed to provide image data to be displayed on the data-driving device, and control data and a clock in a packet form.

In general, the data-processing device may receive image data from a host.

Since data-processing rates of the host and the data-processing device may be different from each other, a memory device configured to buffer image data between the host and the data-processing device may be further included in the display device.

The image data may include a plurality of pieces of frame data, the frame data may include a plurality of pieces of horizontal-line data, and the horizontal-line data may include a plurality of pieces of pixel data.

In an existing scheme in which the memory device buffers image data, the memory device unconditionally stores and outputs a plurality of pieces of pixel data and thus power consumption increases due to a frequent storage and output operation of the memory device.

SUMMARY OF THE INVENTION

In the background, an aspect of embodiments is to provide a technology for reducing power consumption of a display device by reducing a storage operation and an output operation of the memory device for a plurality of pieces of pixel data.

In accordance with an aspect of the present disclosure, a memory device is provided. The memory device includes: a buffer memory configured to store data of one horizontal-line included in data of one frame during a data write operation and output the data of the one horizontal-line during a data read operation; a register configured to store first pixel data among a plurality of pieces of pixel data included in the data of the one horizontal-line; and a buffer controller configured to receive the plurality of pieces of pixel data during the data write operation, but receive the first pixel data, store the first pixel data in the register, receive second pixel data, compare the second pixel data with the first pixel data, and when the first pixel data and the second pixel data are equal to each other, configure flag information for the second pixel data as a first value and not store the second pixel data in the buffer memory.

The buffer controller may start the data read operation during the data write operation.

The buffer controller may start the data read operation after the data write operation has been completed.

In accordance with another aspect of the present disclosure, a read/write method of a memory device including a register and a buffer memory is provided. The read/write method includes: receiving first pixel data included in data of one horizontal-line from a host and storing the first pixel data in the register during a data write operation; receiving second pixel data included in the data of the one horizontal-line from the host; comparing the first pixel data and the second pixel data; when the first pixel data and the second pixel data are equal to each other, configuring flag information for the second pixel data as a first value and not storing the second pixel data in the buffer memory; identifying the flag information for the second pixel data during a data read operation; and when the flag information is the first value, outputting the first pixel data stored in the register at an output time point of the second pixel data.

As described above, according to embodiments, when buffering and outputting horizontal-line data, the memory device can skip storage and output of the same pixel data in and from the buffer memory, thereby reducing power consumption compared to the conventional scheme for unconditionally storing and outputting horizontal-line data in the buffer memory.

DETAILED DESCRIPTION OF THE EXEMPLARY EMBODIMENTS

Figure 1:
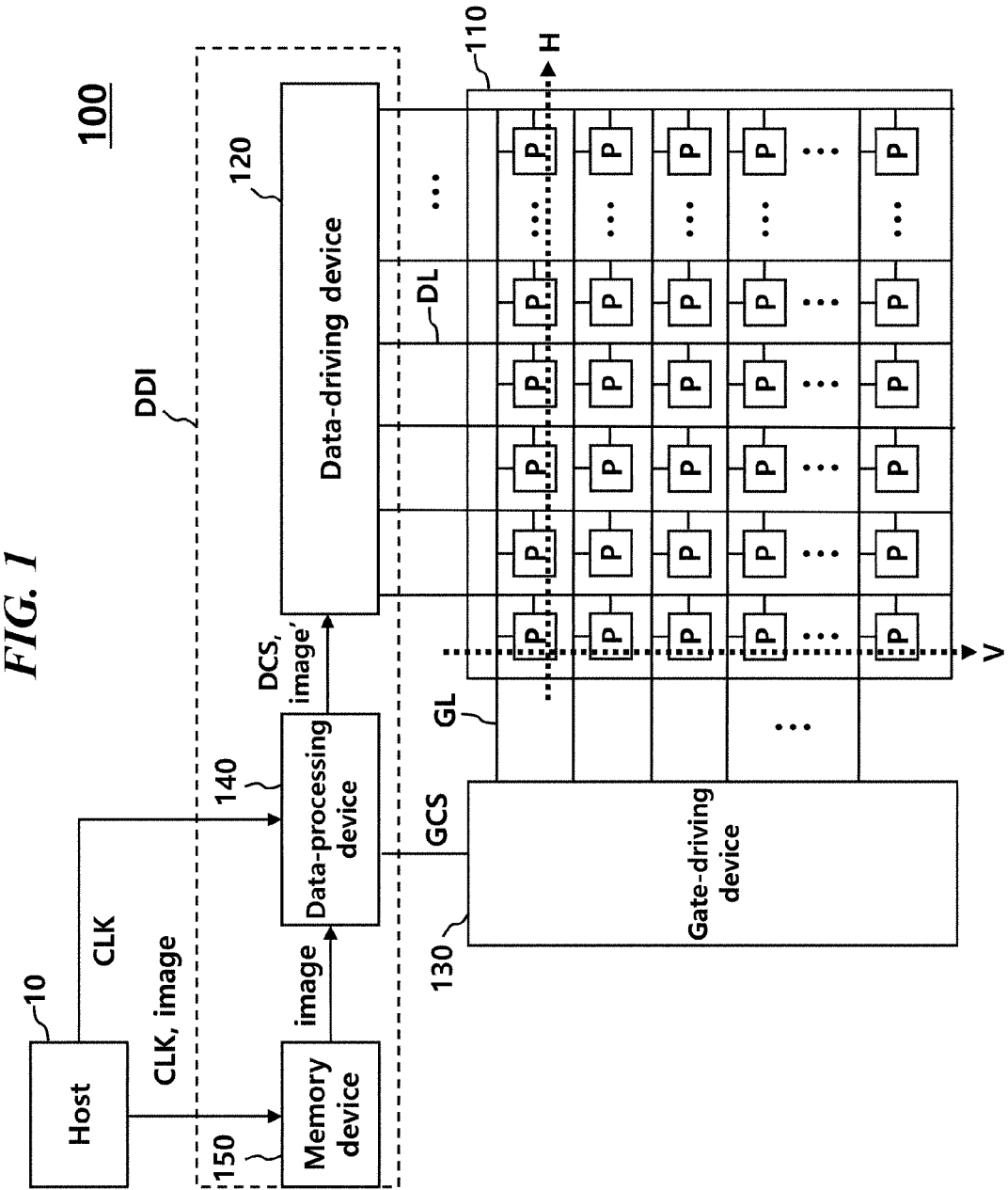
FIG. 1 is a block diagram illustrating a display device according to an embodiment.

FIG. 1 is a block diagram illustrating a display device according to an embodiment.

Referring to FIG. 1, a display device 100 may include a panel 110, a data-driving device 120, a gate-driving device 130, a data-processing device 140, and a memory device 150. The data-driving device 120, the data-processing device 140, and the memory device 150 may be included in one integrated circuit. The integrated circuit including the data-driving device 120, the data-processing device 140, and the memory device 150 may be called a display driver integrated circuit (DDI).

The display driver integrated circuit may receive image data (image) from a host 10 and process the same to fit an internal data format. Further, the display driver integrated circuit may supply a data voltage corresponding to the image data (image) to the display panel 110.

A plurality of data lines DL and a plurality of gate lines GL, and a plurality of pixels P may be disposed on the display panel 110. The plurality of pixels P may be arranged in a horizontal direction H and a vertical direction V of the panel 110 to be adjacent to each other in a square form. The square form may be similar to a matrix, a set of pixels P arranged in the horizontal direction H may be defined as pixel rows or horizontal lines, and a set of the plurality of pixels P arranged in the vertical direction V may be defined as pixel columns or vertical lines.

The pixels P may include an organic light emitting diode and one or more transistors. The transistor may include one of a low-temperature polycrystalline silicon (LTPS) transistor and a low-temperature polycrystalline oxide (LTPO) transistor.

The gate-driving device 130 may supply scan signals of a turn-on voltage or a turn-off voltage to the gate lines GL. When the scan signal of the turn-on voltage is supplied to the pixels P, the corresponding pixels P may be connected to the data lines DL. When the scan signal of the turn-off voltage is supplied to the pixels P, the connection between the corresponding pixels P and the data lines DL may be released.

The data-driving device 120 supplies data voltages to the data lines DL. The data voltages supplied to the data lines DL are transferred to the Pixels P connected to the data lines DL according to the scan signal.

The data-processing device 140 may supply various control signals to the gate-driving device 130 and the data-driving device 120. The data-processing device 140 may generate a gate control signal GCS for starting a scan according to timing implemented in each frame and transmits the gate control signal to the gate-driving device 130. The data-processing device 140 may convert image data (image) input from the memory device 150 to fit a data format used by the data-driving device 120.

The data-processing device 140 may output the converted image data (image) to the data-driving device 120. Further, the data-processing device 140 may transmit a data control signal DCS for controlling the data-driving device 120 to supply the data voltage to each pixel P according to each timing. The data-processing device 140 may generate a gate control signal GCS and a data control signal DCS by using a clock signal CLK received from the host 10.

The memory device 150 may buffer the image data (image) between the host 10 and the data-processing device 140.

In other words, the memory device 150 may temporarily store image data (image) by using the clock signal (CLK) received from the host 10, output the temporarily stored image data (image), and transmit the same to the data-processing device 140.

In an embodiment, the memory device 150 may perform an operation for reducing power consumption of the display device 100.

A detailed description thereof is made below.

Figure 2:
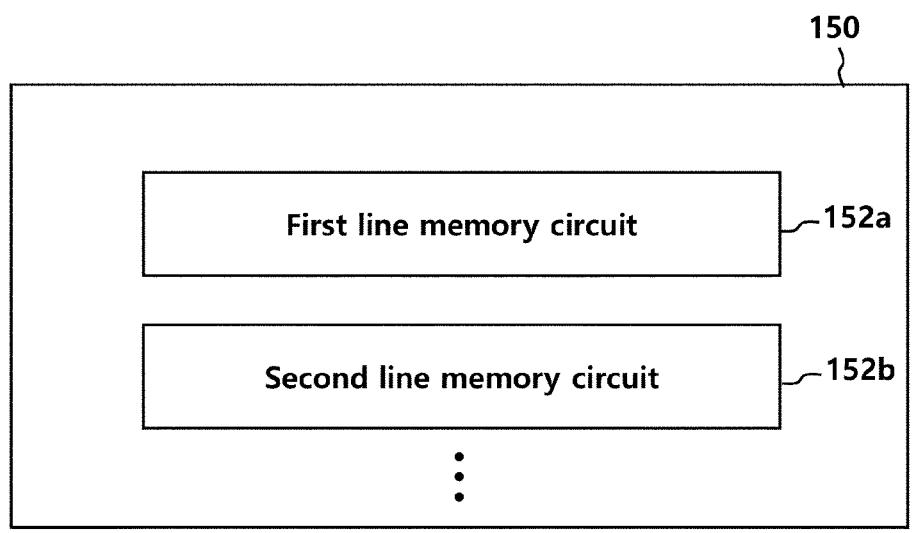
FIG. 2 is a block diagram illustrating a configuration of a memory device according to an embodiment.

FIG. 2 is a block diagram illustrating a configuration of a memory device according to an embodiment.

Referring to FIG. 2, the memory device 150 may include a plurality of line memory circuits including a first line memory circuit 152*a* and a second line memory circuit 152*b*.

Image data (image) may include a plurality of pieces of frame data, and one piece of frame data may include a plurality of pieces of horizontal-line data. One piece of horizontal-line data may include a plurality of pieces of pixel data. The number of the plurality of pieces of horizontal-line data may be the same as the number of pixel rows disposed on the display panel 110, and the number of the plurality of pieces of pixel data may be the same as the number of pixel columns disposed on the display panel 110.

The memory device 150 may buffer the image data (image) received from the host 10 and transmit the same to the data-processing device 140.

The memory device 150 may separate the image data (image) in units of pieces of horizontal-line data and store the same in the plurality of lines memory circuits.

In other words, the memory device 150 may store pieces of horizontal-line data in respective line memory circuits one by one and then output the horizontal-line data. The memory device 150 may transmit the horizontal-line data output from the line memory circuit to the data-processing device 140.

The memory device 150 may process storage and output of the horizontal-line data in a first in first out scheme.

For example, the memory device 150 may store first horizontal-line data in the first line memory circuit 152*a* and second horizontal-line data in the second line memory circuit 152*b*. The memory device 150 may output the first horizontal-line data stored in the first line memory circuit 152*a* and output the second horizontal-line data stored in the second line memory circuit 152*b*.

In an embodiment, an operation in which the memory device 150 stores the horizontal-line data in the line memory circuit may be expressed as a data write operation, and an operation in which the memory device 150 outputs horizontal-line data from the line memory circuit may be expressed as a data read operation.

The data write operation of the memory device 150 may be faster than the data read operation. The memory device 150 may start the data write operation and then start the data read operation after a predetermined time passes. In other words, the data read operation may start while the data write operation is being performed, or the data read operation may start after the data write operation is completed.

As described above, the configuration of the line memory circuit configured to store horizontal-line data during the data write operation and output horizontal-line data during the date read operation is described below.

Figure 3:
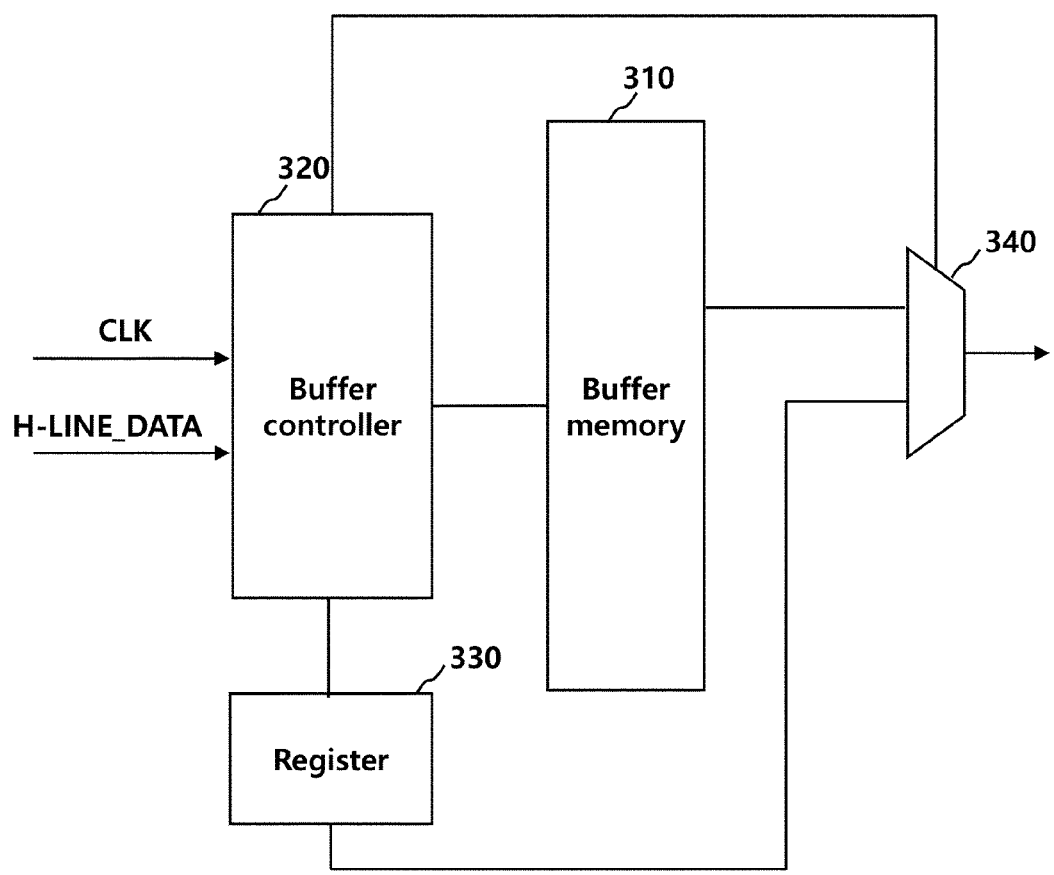
FIG. 3 is a block diagram illustrating a line memory circuit according to an embodiment.

FIG. 3 is a block diagram illustrating a line memory circuit according to an embodiment.

Referring to FIG. 3, the line memory circuit 152 may include a buffer memory 310, a buffer controller 320, a register 330, and a multiplexer 340.

The buffer memory 310 may store horizontal-line data included in frame data during the data write operation and output horizontal-line data during the data read operation. The horizontal-line data output from the buffer memory 310 may be transmitted to the data-processing device 140 through a communication interface of the memory device 150.

In an embodiment, the buffer memory 310 may not store first pixel data among a plurality of pieces of pixel data included in the horizontal-line data and also not store pixel data which is the same as the first pixel data.

In other words, the buffer memory 310 may store pieces of pixel data different form the first pixel data among the plurality of pieces of pixel data during the data write operation.

The buffer memory 310 may output pieces of pixel data different from the first pixel data among the plurality of pieces of pixel data during the data read operation.

The buffer memory 310 may be a volatile memory such as a static random access memory (SRAM) and a dynamic random access memory (DRAM).

The buffer controller 320 may directly receive horizontal-line data H-LINE_DATA from the host 10 or may receive horizontal-line data H-LINE_DATA from another element of the memory device 150 during the data write operation.

The buffer controller 320 may store, in the register 330, the first pixel data among the plurality of pieces of pixel data included in the horizontal-line data H-LINE_DATA during the data write operation. The first pixel data may be 1st pixel data among the plurality of pieces of pixel data.

The first pixel data may be pixel data after first pixel data among the plurality of pieces of pixel data.

The buffer controller 320 storing the first pixel data in the register 330 may receive second pixel data and compare the same with the first pixel data.

When the first pixel data and the second pixel data are the same as each other on the basis of the result of comparison between the first pixel data and the second pixel data, the buffer controller 320 may configure flag information for the second pixel data as a first value. Further, the buffer controller 320 may not store the second pixel data in the buffer memory 310. The buffer controller 320 may compare a bitstream of the first pixel data and a bitstream of the second pixel data and, when the bitstreams are the same as each other, configure flag information for the second pixel data as the first value.

When the first pixel data and the second pixel data are different from each other on the basis of the result of comparison between the first pixel data and the second pixel data, the buffer controller 320 may configure flag information for the second pixel data as a second value. The buffer controller 320 may store the second pixel data in the buffer memory 310. The flag information may be information indicating a target to be compared is the same as the first pixel data, and the first value indicating that the target to be compared and the first pixel data are the same pixel data may be a binary number of "1". The second value indicating that the target to be compared and the first pixel data are different pieces of pixel data may be a binary number of "0".

The buffer controller 320 may compare third pixel data, received after the second pixel data, with the first pixel data.

When the first pixel data and the third pixel data are the same as each other on the basis of the result of comparison between the first pixel data and the third pixel data, the buffer controller 320 may configure flag information for the third pixel data as a first value. Further, the buffer controller 320 may not store the third pixel data in the buffer memory 310.

Figures 4A, 4B, 4C:
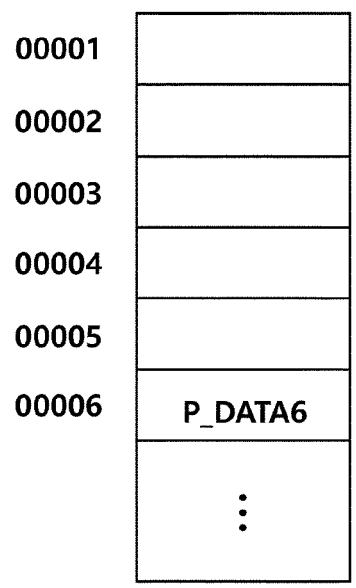
FIGS. 4A, 4B, and 4C illustrate a data write operation and a data read operation of the memory device according to an embodiment.

When the first pixel data and the third pixel data are different from each other on the basis of the result of comparison between the first pixel data and the third pixel data, the buffer controller 320 may configure flag information for the third pixel data as a second value. The buffer controller 320 may store the third pixel data in the buffer memory 310. The buffer controller 320 may include a storage area for storing flag information for a plurality of pieces of pixel data. The storage area of the buffer controller 320 may be divided into a plurality of bitstreams as illustrated in FIG. 4B. The number of a plurality of bitstreams may be the same as the number of a plurality of pieces of pixel data.

The buffer controller 320 may repeatedly implement the configuration for pieces of pixel data received after the third pixel data. The buffer controller 320 may repeatedly implement the configuration on the basis of a clock signal CLK.

Accordingly, the buffer controller 320 may store only pixel data different from the first pixel data among the plurality of pieces of pixel data included in the horizontal-line data in the buffer memory 310 and may not store pixel data which is the same as the first pixel data in the buffer memory 310.

Meanwhile, the buffer controller 320 may identify flag information for the second pixel data during the data read operation.

When the flag information for the second pixel data is the first value, the buffer controller 320 may control the register 330 to output the first pixel data at an output time point of the second pixel data.

When the flag information for the second pixel data is the second value, the buffer controller 320 may control the buffer memory 310 to output the second pixel data at an output time point of the second pixel data. The buffer controller 320 may determine the output time point of the second pixel data by using the clock signal CLK and control the register 330 to output the first pixel data before the output time point of the second pixel data.

After the output time point of the second pixel data, the buffer controller 320 may identify flag information for the third pixel data.

When the flag information for the third pixel data is the first value, the buffer controller 320 may control the register 330 to output the first pixel data at an output time point of the third pixel data.

When the flag information for the third pixel data is the second value, the buffer controller 320 may control the buffer memory 310 to output the third pixel data at an output time point of the third pixel data.

The buffer controller 320 may repeatedly implement the configuration for pixel data output after the third pixel data.

The buffer controller 320 may remove the first pixel data from the register 330 after completing the data read operation for the plurality of pieces of pixel data included in the horizontal-line data.

The register 330 may store the first pixel data among the plurality of pieces of pixel data included in the horizontal-line data.

The register 330 may output the first pixel data by the control of the buffer controller 320 during the data read operation.

The register 330 may include one or more flip flops.

The multiplexer 340 may output the first pixel data output from the register 330 by the control of the buffer controller 320 to the outside of the line memory circuit 152 or output the pixel data output from the buffer memory 310 to the outside of the line memory circuit 152 during the data read operation.

As described above, since storage and output of the same pixel data in and from the buffer memory 310 may be skipped when horizontal-line data is buffered and output by the line memory circuit 152, power consumption can be reduced compared to the conventional scheme in which horizontal-line data is unconditionally stored in and output from the buffer memory.

For example, among a plurality of pieces of pixel data illustrated in FIG. 4A, when second pixel data P_DATA2 to fifth pixel data P_DATA5 are the same pixel data as first pixel data P_DATA1, and sixth pixel data P_DATA6 is pixel data different from the first pixel data, the buffer controller 320 may store the first pixel data in the register 330 and configure flag information for the first pixel data as a binary number "1" which is a first value during the data write operation.

The buffer controller 320 may sequentially receive the second pixel data to the fifth pixel data, compare them with the first pixel data, and configure flag information for each piece of the second pixel data to the fifth pixel data as the first value. The second pixel data P_DATA2 to the fifth pixel data P_DATA5 may not be stored in a second storage area 00002 to a fifth storage area 00005 of the buffer memory 310 illustrated in FIG. 4C.

The buffer controller 320 may receive sixth pixel data P_DATA6, compare the sixth pixel data with the first pixel data P_DATA1, and then configure flag information for the sixth pixel data as a second value. The sixth pixel data may be stored in a sixth storage area 00006 of the buffer memory 310 illustrated in FIG. 4C.

The buffer controller 320 may identify that the flag information for the first pixel data is the first value during the data read operation, output the first pixel data stored in the register 330 at an output time point of the first pixel data, and output the first pixel data stored in the register 330 at output time points of the second pixel data to the fifth pixel data.

The buffer controller 320 may identify that flag information for the sixth pixel data is the second value and output the sixth pixel data stored in the sixth storage area of the buffer memory 310 at an output time point of the sixth pixel data.

As described above, in an embodiment, since only pixel data different from the pixel data that is a comparison reference is stored in and output from the buffer memory 310, power consumption by the storage and output of the buffer memory 310 may be reduced.

Hereinafter, a process for performing the data write operation and a process for the data read operation by the memory device 150 including the line memory circuit are described.

Figure 5:
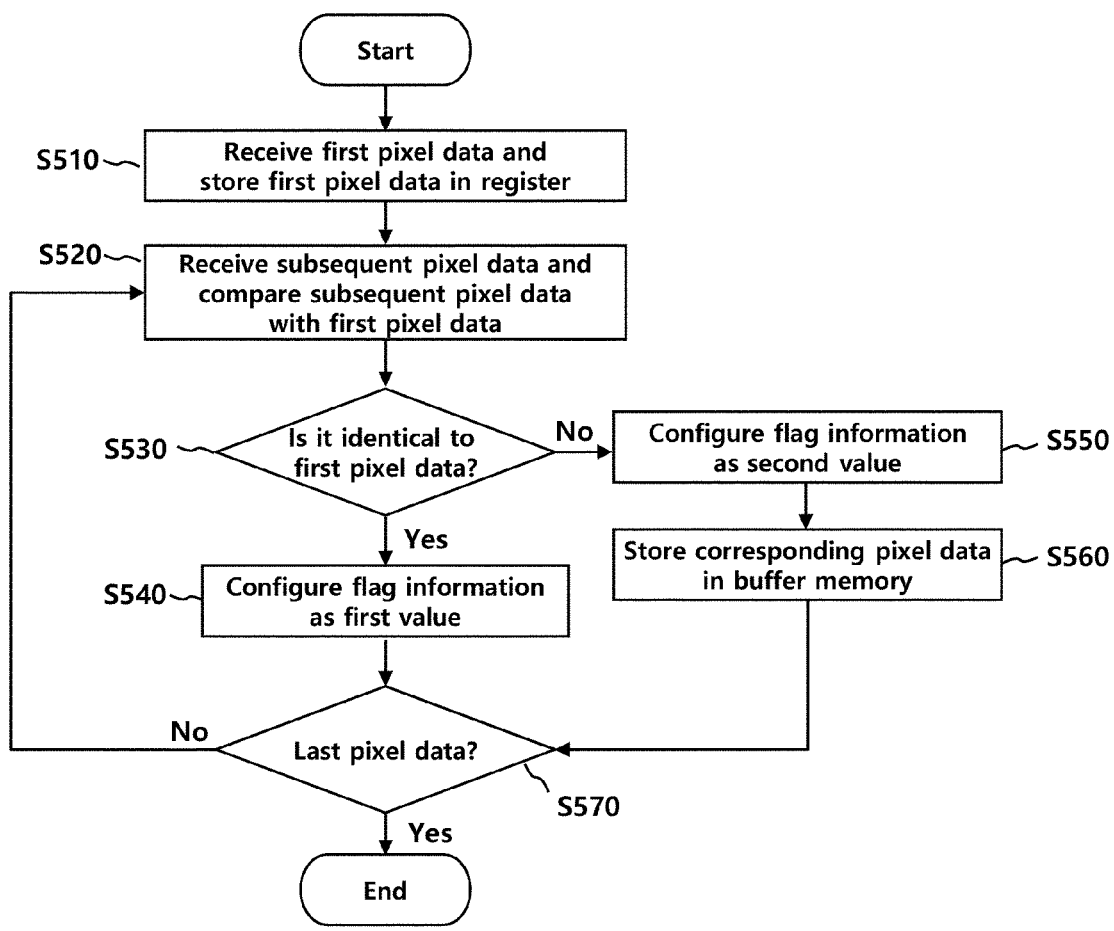
FIG. 5 is a flowchart illustrating a process for performing the data write operation by the memory device according to an embodiment.

FIG. 5 is a flowchart illustrating the process for performing the data write operation by the memory device according to an embodiment.

Referring to FIG. 5, the memory device 150 may receive first pixel data included in one piece of horizontal-line data from the host 10 and store the same in the register 330 of the line memory circuit 152 during the data write operation in S510. The line memory circuit 152 may be one of a plurality of line memory circuits included in the memory device 150.

The memory device 150 may receive second pixel data which is pixel data after the first pixel data from the host 10 and compare the first pixel data and the second pixel data in S520. At this time, the memory device 150 may compare a bitstream of the first pixel data and a bitstream of the second pixel data.

When the first pixel data and the second pixel data are the same as each other on the basis of the result of comparison between the first pixel data and the second pixel data, the memory device 150 may configure flag information for the second pixel data as a first value and may not store the second pixel data in the buffer memory 310 of the line memory circuit 152 in S530 and S540.

When the first pixel data and the second pixel data are different from each other in S530, the memory device 150 may configure flag information for the second pixel data as a second value in S550. The second pixel data may be stored in the buffer memory 310 of the line memory circuit 152 in S560.

The memory device 150 may perform S520 to S540 for pixel data received after the second pixel data or perform S520, S530, S550, and S560 in S570.

Figure 6:
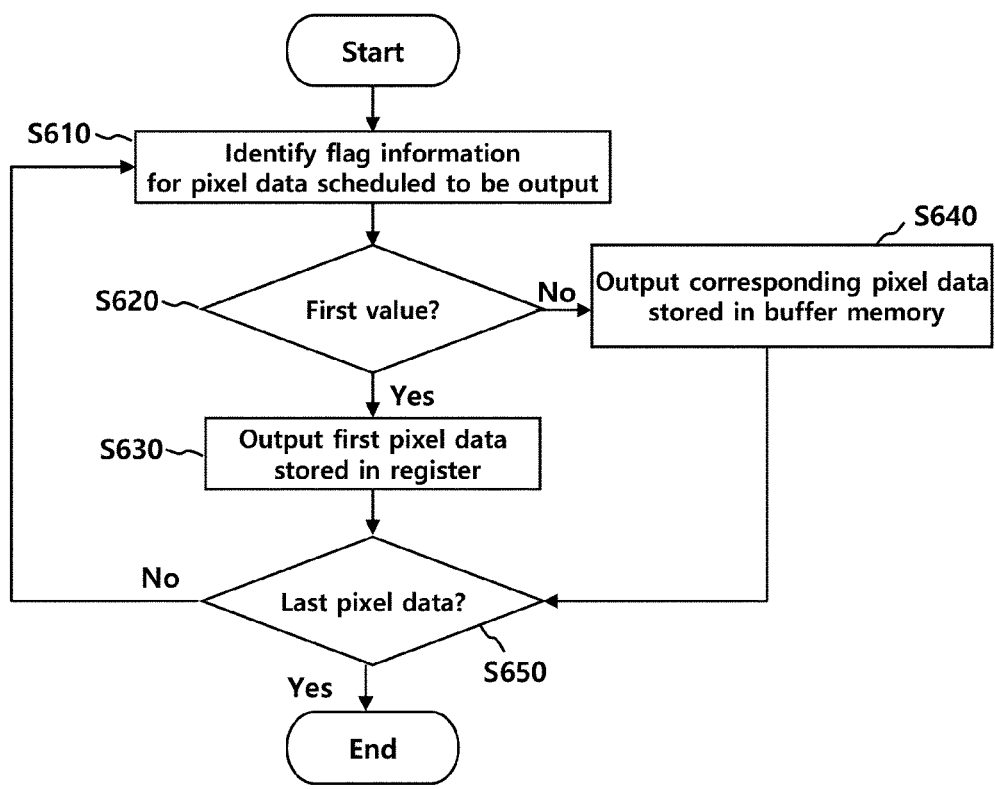
FIG. 6 is a flowchart illustrating a process for performing the data read operation by the memory device according to an embodiment.

FIG. 6 is a flowchart illustrating the process for performing the data read operation by the memory device according to an embodiment.

Referring to FIG. 6, the memory device 150 may identify flag information for the second pixel data, scheduled to be output, during the data read operation in S610. The memory device 150 may output the first pixel data stored in the register 330 of the line memory circuit 152 before S610.

When the flag information for the second pixel data is the first value, the memory device 150 may output the first pixel data stored in the register 330 at an output time point of the second pixel data in S620 and S630. In S630, the memory device 150 may determine an output time point of pixel data by using a clock signal CLK received from the host 10 and transmit the first pixel data output from the register 330 to the data-processing device 140.

When the flag information for the second pixel data is the second value in S620, the memory device 150 may output the second pixel data stored in the buffer memory 310 at the output time point of the second pixel data in S640.

The memory device 150 may perform S620 to S630 for pixel data received after the second pixel data or perform S620 and S640 in S650.

The memory device 150 may remove the first pixel data from the register 330 after completing the data read operation for the plurality of pieces of pixel data included in one piece of the horizontal-line data.

Further, the data write operation illustrated in FIG. 5 and the data read operation illustrated in FIG. 6 may be performed for other horizontal-line data.

In an embodiment, the memory device 150 may perform the data read operation for one piece of horizontal-line data during the data write operation for one piece of horizontal-line data.

The memory device 150 may perform the data read operation for one piece of horizontal-line data after completing the data write operation for one piece of the horizontal-line data.

What is claimed is:

1. A memory device comprising:
    a buffer memory configured to store data of one horizontal-line included in data of one frame during a data write operation and output the data of the one horizontal-line during a data read operation;
    a register configured to store first pixel data among a plurality of pieces of pixel data included in the data of the one horizontal-line; and
    a buffer controller configured to receive the first pixel data included in the data of the one horizontal-line, store the first pixel data included in the data of the one horizontal-line in the register, receive second pixel data included in the data of the one horizontal-line, wherein the second pixel data is subsequent to the first pixel data in the data of the one horizontal-line, and compare the second pixel data with the first pixel data, wherein when the first pixel data and the second pixel data are identical, the buffer controller is configured to configure flag information for the second pixel data as a first value, and not store the second pixel data in the buffer memory during the data write operation.

2. The memory device of claim 1, wherein the buffer controller is configured to, when the first pixel data and the second pixel data are different from each other, configure the flag information for the second pixel data as a second value and store the second pixel data in the buffer memory.

3. The memory device of claim 2, wherein the buffer controller is configured to identify the flag information for the second pixel data during the data read operation, control the register to output the first pixel data at an output time point of the second pixel data when the flag information is the first value, and control the buffer memory to output the second pixel data at the output time point of the second pixel data when the flag information is the second value.

4. The memory device of claim 1, wherein the buffer controller starts the data read operation while the data write operation is being performed.

5. The memory device of claim 1, wherein the buffer controller starts the data read operation after the data write operation has been completed.

6. The memory device of claim 1, wherein the buffer controller is configured to remove the first pixel data from the register after completing the data read operation for the data of the one horizontal-line.

7. The memory device of claim 1, wherein the buffer controller comprises a storage area configured to store flag information for each of the plurality of pieces of pixel data included in the data of the one horizontal-line.

8. The memory device of claim 1, wherein the buffer controller is configured to compare a bitstream of the first pixel data and a bitstream of the second pixel data and, when the bitstreams are equal to each other, configure the flag information for the second pixel data as the first value and not store the second pixel data in the buffer memory.

9. The memory device of claim 1, wherein the buffer memory comprises at least one of a Static Random Access Memory (SRAM) and a Dynamic Random Access Memory (DRAM).

10. The memory device of claim 1, wherein the register comprises one or more flip flops.

11. The memory device of claim 1, wherein
the first pixel data and the second pixel data are identical;
the flag information for the second pixel data is the first value,
the buffer controller is configured to receive third pixel data included in the data of the one-horizontal line,
in the data of the one-horizontal line, the third pixel data is subsequent to the second pixel data,
the third pixel data is different from the first pixel data and the second pixel data; and
the buffer controller is configured to configure flag information for the third pixel data as a second value and store the third pixel data in the buffer memory during the data write operation.

12. A read/write method of a memory device comprising a register and a buffer memory, the read/write method comprising:
receiving first pixel data included in data of one horizontal-line from a host and storing the first pixel data included in the data of the one horizontal-line in the register during a data write operation;
receiving second pixel data included in the data of the one horizontal-line, wherein the second pixel data is subsequent to the first pixel data included in the data of the one horizontal-line from the host;
comparing the first pixel data and the second pixel data;
when the first pixel data and the second pixel data are identical, configuring flag information for the second pixel data as a first value and not storing the second pixel data in the buffer memory;
identifying the flag information for the second pixel data included in the data of the one horizontal-line during a data read operation; and
when the flag information is the first value, outputting the first pixel data included in the data of the one horizontal-line stored in the register at an output time point of the second pixel data included in the data of the one horizontal-line.

13. The read/write method of claim 12, further comprising, after not storing the second pixel data:
receiving third pixel data included in the data of the one horizontal-line from the host;
comparing the first pixel data included in the data of the one horizontal-line and the third pixel data included in the data of the one horizontal-line;
when the first pixel data and the third pixel data are identical, configuring flag information for the third pixel data as a first value and not storing the third pixel data in the buffer memory;
identifying the flag information for the third pixel data during the data read operation; and
when the flag information is the first value, outputting the first pixel data included in the data of the one horizontal-line stored in the register at an output time point of the third pixel data included in the data of the one horizontal-line.

14. The read/write method of claim 13, wherein
the first pixel data and the second pixel data are identical,
the flag information for the second pixel data is the first value,
the third pixel data is different from the first pixel data and the second pixel data, and
the flag information for the third pixel data is a second value.

15. The read/write method of claim 12, wherein, in comparing the first pixel data and the second pixel data, the memory device compares a bitstream of the first pixel data and a bitstream of the second pixel data.

16. The read/write method of claim 12, further comprising, after comparing the first pixel data and the second pixel data:
when the first pixel data and the second pixel date are different, configuring the flag information for the second pixel data as a second value and storing the second pixel data in the buffer memory;
identifying that the flag information for the second pixel data is the second value during the data read operation; and
outputting the second pixel data stored in the buffer memory at the output time point of the second pixel data.

* * * * *